(12) United States Patent
Yao et al.

(10) Patent No.: US 7,596,841 B2
(45) Date of Patent: Oct. 6, 2009

(54) MICRO-ELECTROMECHANICAL DEVICES AND METHODS OF FABRICATING THEREOF

(75) Inventors: Kui Yao, Singapore (SG); Xiao Song Eric Tang, Singapore (SG); Peng Gao, Singapore (SG); Xujiang He, Singapore (SG); Jian Zhang, Singapore (SG); Santiranjan Shannigrahi, Singapore (SG)

(73) Assignees: Agency for Science Technology and Research, Singapore (SG); Sony Corporation, Tokyo (JP)

( * ) Notice: Subject to any disclaimer, the term of this patent is extended or adjusted under 35 U.S.C. 154(b) by 0 days.

(21) Appl. No.: 11/568,114

(22) PCT Filed: Apr. 23, 2004

(86) PCT No.: PCT/SG2004/000107

§ 371 (c)(1),
(2), (4) Date: Oct. 19, 2006

(87) PCT Pub. No.: WO2005/104257

PCT Pub. Date: Nov. 3, 2005

(65) Prior Publication Data

US 2007/0164634 A1    Jul. 19, 2007

(51) Int. Cl.
*H01L 41/22* (2006.01)
*H01L 41/00* (2006.01)

(52) U.S. Cl. ............... 29/25.35; 29/25.42; 29/594; 29/602.1; 29/840; 29/845; 310/313 B; 310/358

(58) Field of Classification Search .......... 29/25.35, 29/602.1, 594, 595, 827, 832, 25.42, 739–740, 29/840–845; 310/321, 333, 349, 342, 370, 310/311, 324–328, 364, 313 A–313 B
See application file for complete search history.

(56) References Cited

U.S. PATENT DOCUMENTS

| 4,848,157 | A | * | 7/1989 | Kobayashi | ............. 73/514.33 |
| 5,656,778 | A | * | 8/1997 | Roszhart | ................. 73/504.04 |
| 6,069,433 | A | * | 5/2000 | Lazarus et al. | ............. 310/333 |

(Continued)

FOREIGN PATENT DOCUMENTS

CA    1154862    10/1983

(Continued)

OTHER PUBLICATIONS

Trindade Ma et al., Parametric analysis of the vibration control of sandwich beams through shear-based piezoelectric actuation, Journal of Intelligent Material Systems and Structures, 10(5), 377-385, May 1999, Technomic Publ. Co. Inc.

(Continued)

*Primary Examiner*—Minh Trinh
*Assistant Examiner*—Tai Nguyen
(74) *Attorney, Agent, or Firm*—Horizon IP Pte Ltd

(57) ABSTRACT

An electromechanical device includes a support structure formed by attaching inner surfaces of second and third substrates to a first substrate. The support structure includes at least one cavity between the second and third layers. An electromechanical active element is provided on an outer surface of at least one of the second or third layers.

24 Claims, 12 Drawing Sheets

U.S. PATENT DOCUMENTS

| | | | |
|---|---|---|---|
| 6,109,104 A | 8/2000 | Fukuda et al. | |
| 6,134,042 A * | 10/2000 | Dhuler et al. | 359/224 |
| 6,140,739 A | 10/2000 | Arai et al. | |
| 6,159,385 A * | 12/2000 | Yao et al. | 216/2 |
| 6,323,582 B1 | 11/2001 | Takeuchi et al. | |
| 6,329,740 B1 | 12/2001 | Hirota et al. | |
| 6,333,681 B1 * | 12/2001 | Takeuchi et al. | 310/331 |
| 6,335,586 B1 | 1/2002 | Takeuchi et al. | |
| 6,342,751 B1 | 1/2002 | Takeuchi et al. | |
| 6,351,056 B1 | 2/2002 | Takeuchi et al. | |
| 6,396,193 B1 | 5/2002 | Takeuchi et al. | |
| 6,404,109 B1 | 6/2002 | Takeuchi et al. | |
| 6,445,841 B1 * | 9/2002 | Gloeckner et al. | 385/17 |
| 6,448,691 B1 | 9/2002 | Takeuchi et al. | |
| 6,448,693 B1 | 9/2002 | Takeuchi et al. | |
| 6,452,309 B1 | 9/2002 | Takeuchi et al. | |
| 6,455,981 B1 | 9/2002 | Takeuchi et al. | |
| 6,455,984 B1 | 9/2002 | Takeuchi et al. | |
| 6,472,799 B2 | 10/2002 | Takeuchi et al. | |
| 6,476,538 B2 | 11/2002 | Takeuchi et al. | |
| 6,476,539 B1 | 11/2002 | Takeuchi et al. | |
| 6,498,419 B1 | 12/2002 | Takeuchi et al. | |
| 6,525,448 B1 | 2/2003 | Takeuchi et al. | |
| 6,531,805 B2 | 3/2003 | Ikeda et al. | |
| 6,534,898 B1 | 3/2003 | Takeuchi et al. | |
| 6,534,899 B1 | 3/2003 | Takeuchi et al. | |
| 6,538,362 B1 | 3/2003 | Takeuchi et al. | |
| 6,566,789 B2 | 5/2003 | Takeuchi et al. | |
| 6,570,297 B1 | 5/2003 | Takeuchi et al. | |
| 2002/0093271 A1 | 7/2002 | Ikeda et al. | |
| 2002/0140320 A1 | 10/2002 | Unno et al. | |
| 2002/0174891 A1 * | 11/2002 | Maluf et al. | 137/14 |
| 2003/0127946 A1 | 7/2003 | Yamada et al. | |

FOREIGN PATENT DOCUMENTS

| | | |
|---|---|---|
| EP | 253375 B1 | 2/1993 |
| JP | 2001-169572 | 6/2001 |
| JP | 2001-210887 | 8/2001 |
| JP | 2001-274473 | 10/2001 |
| JP | 2001-284672 | 10/2001 |
| JP | 2001-315099 | 11/2001 |
| JP | 2001-315100 | 11/2001 |
| JP | 2001-320099 | 11/2001 |
| JP | 2001-320100 | 11/2001 |
| JP | 2001-320101 | 11/2001 |
| JP | 2001-320103 | 11/2001 |
| JP | 2001-320104 | 11/2001 |
| JP | 2001-320105 | 11/2001 |
| JP | 2001-026411 | 1/2002 |
| JP | 2002-026413 | 1/2002 |
| JP | 2002-033530 | 1/2002 |
| JP | 2002-299713 | 10/2002 |
| JP | 2003-008093 | 1/2003 |
| WO | 1998/016956 A1 | 4/1998 |
| WO | 2003/055063 A1 | 7/2003 |

OTHER PUBLICATIONS

Trindade Ma et al., Piezoelectric Active Vibration Control of Damped Sandwich Beams, Journal of Sound and Vibration, (2001) 246(4), 653-677, Academic Press.

Sun CT and Zhang XD, Use of Thickness-Shear Mode in Adaptive Sandwich Structures, Smart Material Structures, 4 (1995), 202-206, IOP Publishing Ltd.

Benjeddou A et al., Piezoelectric Actuation Mechanisms for Intelligent Sandwich Structures, Smart Material Structures, 9 (2000), 328-335, IOP Publishing Ltd.

Kui Yao and Kenji Uchino, Analysis on a composite cantilever beam coupling a piezoelectric bimorph to an elastic blade, Sensors and Actuators, A 89 (2001), 215-221, Elsevier Science B.V.

* cited by examiner

MICRO-ELECTROMECHANICAL DEVICES AND METHODS OF FABRICATING THEREOF

FIELD OF THE INVENTION

This invention relates to electromechanical devices in general. More particularly, the invention relates to forming piezoelectric devices by micromachining techniques.

BACKGROUND OF THE INVENTION

FIG. 1 shows a conventional electromechanical device 101, such as a piezoelectric device. The piezoelectric device typically comprises a support structure 102 having piezoelectric ceramic elements 104a-b disposed on at least one surface of the support structure. The support structure 102 is formed by stamping, bending and/or moulding a metal plate into suitable shapes. Piezoelectric elements 104a-b are disposed on the support structure.

The piezoelectric films are deposited on the surface of the metal support structure. However, the metal parts are easily oxidized at elevated temperatures in the oxygenated atmosphere that is required for processing the piezoelectric thin films. Further, the process for producing the piezoelectric films has to be adapted to reduce oxidation of the metal parts. As such, the piezoelectric films are produced at lower temperatures using, for example, hydrothermal growth. Such methods produce films with properties and mechanical adhesion that are inferior to those produced with high temperature annealing by, for example, sputtering, MOCVD or sol-gel methods. Moreover, the structures are immersed in corrosive solutions to realize the hydrothermal growth, which results in severe contamination and processing compatibility problems.

Therefore, from the foregoing discussion, it is desirable to provide reliable electromechanical devices.

SUMMARY OF THE INVENTION

The invention relates generally to electromechanical devices. In one embodiment, the invention relates to fabricating an electromechanical device. The method comprises forming a support structure of the electromechanical device by providing first, second and third layers. The inner surfaces of the second and third layers are attached to the first layer, forming a support structure having at least one cavity. After the support structure is formed, an electromechanical active element on the outer surface of at least one of the second and third layers is provided.

In one embodiment, the first, second, and third layers are formed from single crystal silicon. In another embodiment, the first layer is formed from glass and the second and third layers are formed from single crystal silicon. The electromechanical active element comprises first and second electrodes separated by a piezoelectric film. Furthermore, the electromechanical device is conducive to micromachining and batch processing, facilitating miniaturization and reducing manufacturing cost.

PREFERRED EMBODIMENTS OF THE INVENTION

Figure 1:
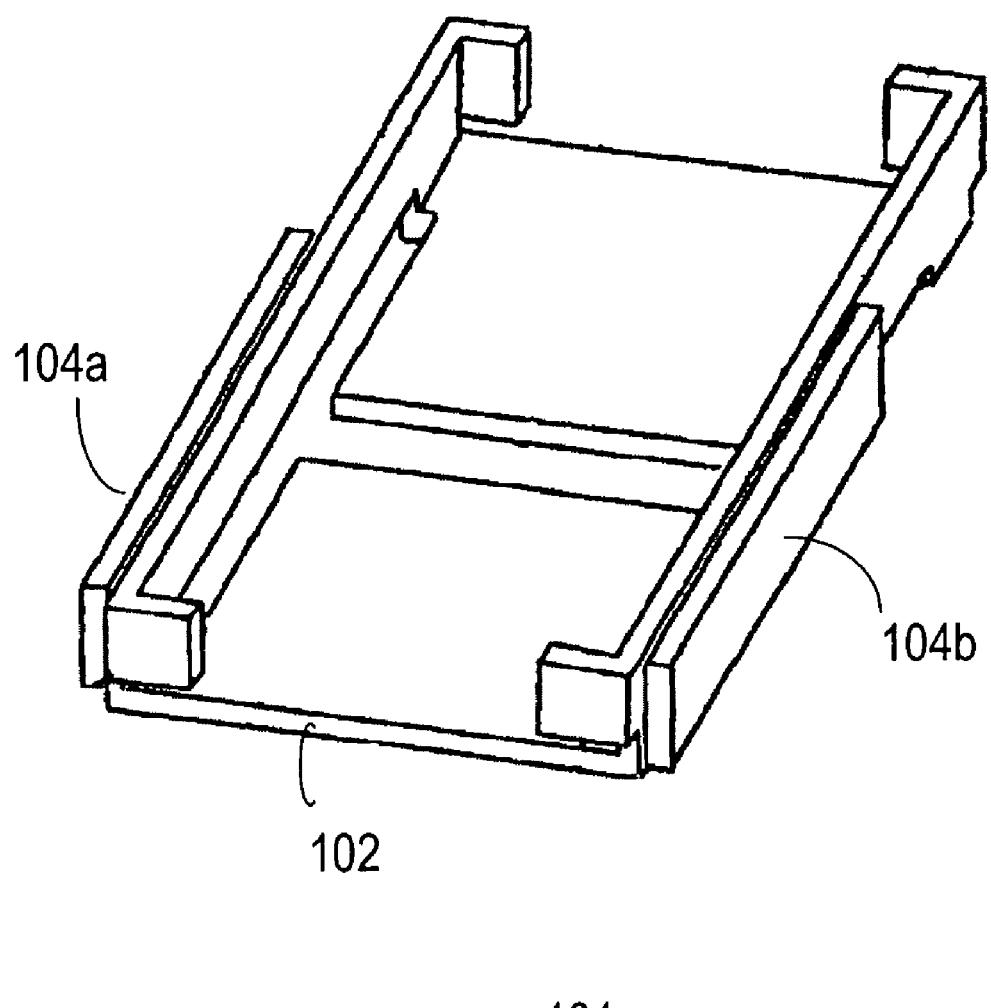
FIG. 1 shows a conventional electromechanical device.
Figure 2:
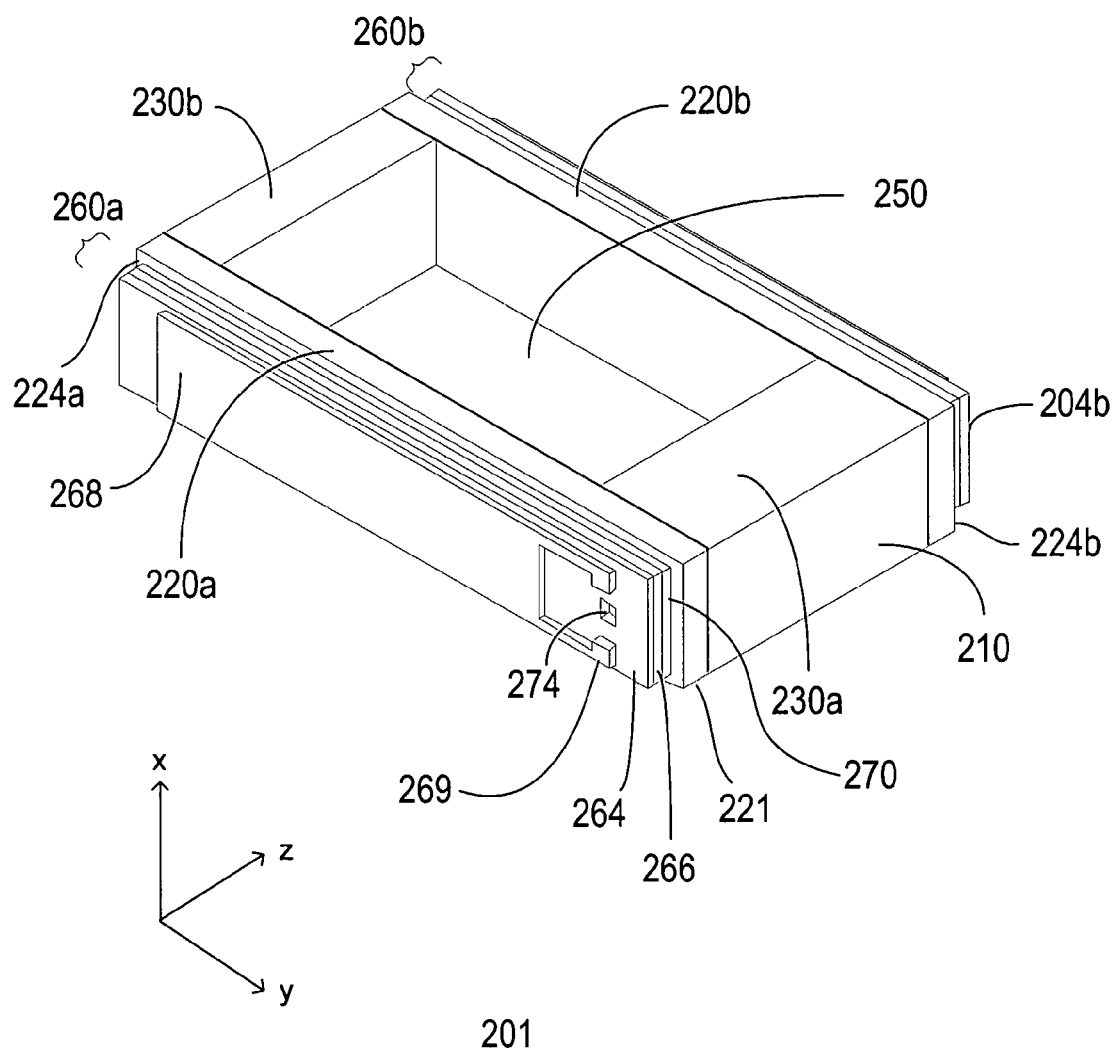
FIG. 2 shows an electromechanical device in accordance with one embodiment of the invention.

FIG. 2 shows an electromechanical device 201 in accordance with one embodiment of the invention. The electromechanical device comprises a support structure 210 having first and second major outer surfaces 224a-b of the support structure. The major outer surfaces are located on opposite sides of the structure, separated by a cavity 250. The electromechanical device is conducive to parallel fabrication techniques to increase throughput and reduce manufacturing costs. In one embodiment, the electromechanical device is formed by micromachining techniques, such as those employed in micro-electromechanical systems (MEMS).

Figure 3:
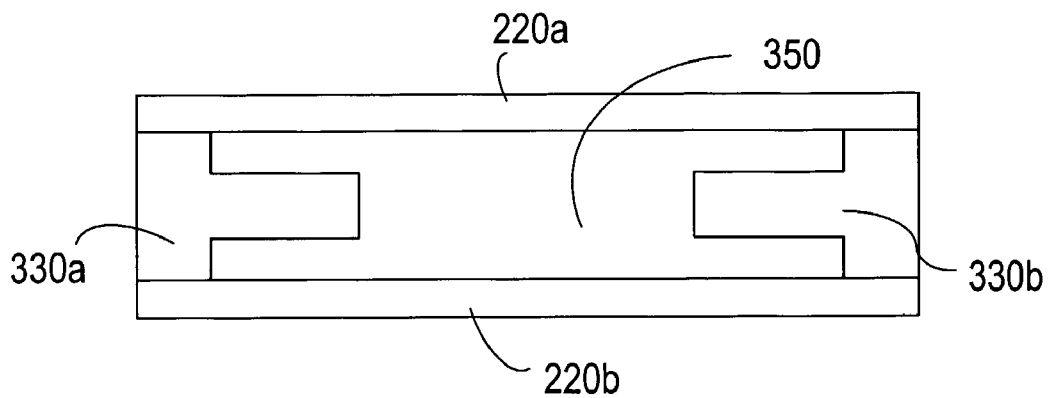
FIGS. 3-6 show electromechanical devices in accordance with various embodiments of the invention.

In one embodiment, the major outer surfaces are provided by first and second major support members 220a-b. The major support members, in one embodiment, are attached to a central portion of the support structure provided by at least one minor support member 230. As shown, first and second minor support members 230a-b are provided to which the major support members are attached. In one embodiment, the shape of the minor support members defines the shape of the cavity. The shape of the cavity should be selected to provide the structure with sufficient compliance for generating desired amount of bending deformation or vibration. In one embodiment, the cavity comprises a rectangular shape. Other geometric shapes are also useful, depending on design requirements. For example, the cavity 350 can be H-shaped, formed by the shapes of the minor members 330a-b, as shown in FIG. 3.

In another embodiment, the support structure comprises more than one cavity. The cavities can be created by any number of minor support members. For example, referring to FIG. 4, first and second cavities 450a-b are created by a single support member 430. Alternatively, first and second cavities 550a-b can be formed by first, second and third minor support members 530 a-c, as shown in FIG. 5. Although the cavities are depicted as rectangular in shape, it is understood, as already discussed, other geometric shapes are also useful. Furthermore, the shapes of the different cavities can be the same, different or mirror images of each other.

Referring back to FIG. 2, numerous types of materials can be used to form the support structure. In one embodiment, the support structure comprises materials that can withstand the various processing conditions for fabricating the electromechanical device. For example, where the active electromechanical elements, such as piezoelectric films, are formed directly on the major surfaces 224a-b, the materials of the support structure should not exhibit significant expansion, shrinkage or deformation as a result of the wide temperature range changes experienced during processing.

The various support members can be formed from the same or different materials. In one embodiment, the minor members comprise a first material while the major support members comprise a second material. In one embodiment, the first material of the support members is derived from a larger first substrate to facilitate parallel processing of numerous devices simultaneously. The second material of the two major support members is derived from two larger second substrates attached to the first substrate. It is understood that the two major support members need not be formed from the same material nor the first and second materials be of different materials.

The materials of the support members comprise, for example, silicon or glass. Other types of materials, such as ceramic, glass-ceramic, other crystalline, single crystalline or non-crystalline materials, or a combination thereof, are also useful. In one embodiment, the first and second materials comprise a crystalline material. In one embodiment, the first and second materials comprise single crystalline silicon. Other types of crystalline materials are also useful. The silicon is provided by silicon wafers to facilitate parallel processing of the devices.

In one embodiment, the first crystalline silicon wafer which provides the minor support members is oriented in the <110> crystallographic direction that is parallel to the direction in which the wafers are attached (i.e., z direction). The second and third silicon wafers which are attached to the opposing major surfaces of the first silicon wafer for forming the major support members are oriented in either the <100> or <110> crystallographic direction parallel to the z-direction. Other crystalline wafer orientations may also useful. The wafers are attached, in one embodiment, using elevated temperature processes. Such processes include, for example, silicon-to-silicon fusion bonding. Other attachment techniques, such as the use of an intermediate layer to facilitate adhesion, laser assisted bonding and anodic bonding, are also useful and may depend on the type of materials used.

In one embodiment, an electromechanical active element is provided on at least one of the first and second major outer surfaces of the support structure. In one embodiment, electromechanical active elements 260*a-b* are provided on the first and second major outer surfaces of the support structure. Providing more than first and second electromechanical active elements, including for example on surfaces other than the major outer surfaces, are also useful.

In one embodiment, an active electromechanical element comprises a piezoelectric stack for forming a piezoelectric device. Other types of electromechanical active elements are also useful. The piezoelectric stack comprises an active material or film 264 sandwiched between first and second electrodes 266 and 268. In one embodiment, the active film comprises a piezoelectric film. Other types of active films are also useful. The first electrode is the bottom electrode and the second electrode is the top electrode. The use of other types of multi-layered piezoelectric stacks, such as those having more than two electrodes, each separated by an active film, is also useful.

Various types of piezoelectric materials can be used to form the active film. In one embodiment, the piezoelectric material comprises a piezoelectric ceramic material. The piezoelectric ceramic material comprises, for example, lead titanate (PT), lead zirconate titanate (PZT), lead magnesium niobate (PMN), lead zinc niobate (PZN) or a combination thereof. Other types of piezoelectric ceramics are also useful. In one embodiment, the piezoelectric ceramic includes a composition around the morphotropic phase boundary (MPB), such as $Pb(Zr_{0.52}Ti_{0.48})O_3$, or $0.7\ Pb(Mg_{1/3}Nb_{2/3})O_3$-$0.3\ PbTiO_3$. As already discussed, other types of materials can also be used to form the active film. Such materials comprise, for example, electrostrictive materials including electrostrictive ceramics, ferroelectric ceramics or antiferroelectric ceramics.

In one embodiment, the electrodes are formed from a conductive material which is a solid at room temperature. The conductive material comprises a material which should be stable with the piezoelectric material. The conductive material comprises, for example, a noble metal or alloys thereof. Conductive materials, such as conducting ceramics, are also useful. Other types of conductive materials are also useful. In one embodiment, the lower electrode comprises platinum and the upper electrode comprises gold. Other combinations of materials for different electrodes are also useful. For example, both electrodes can be formed from the same material or different types of materials.

In one embodiment, an insulating layer 270 is provided between the bottom electrode and the major support surface, insulating the bottom electrode from the major support member and/or enhancing the adhesion between the two. The use of an insulating layer is particularly useful for applications in which the support structure is formed from non-insulating materials. The insulator layer comprises, for example, a dielectric material, such as $SiO_2$. Other types of insulating or dielectric materials can also be used.

The top electrode, as shown, includes at least one contact pad 269. In one embodiment, the contact pad is located at or toward a first end 221 of the major support member. To provide access to the bottom electrode, a contact opening or window 274 is provided. The contact window, in one embodiment, is located at the first end of the major support member. A sufficient amount of space should be provided between the contact pads and window to avoid shorting problems. Locating the contact pad and contact window at other locations is also useful. For example, the contact pad and window need not be located in proximity to each other.

Figure 6:
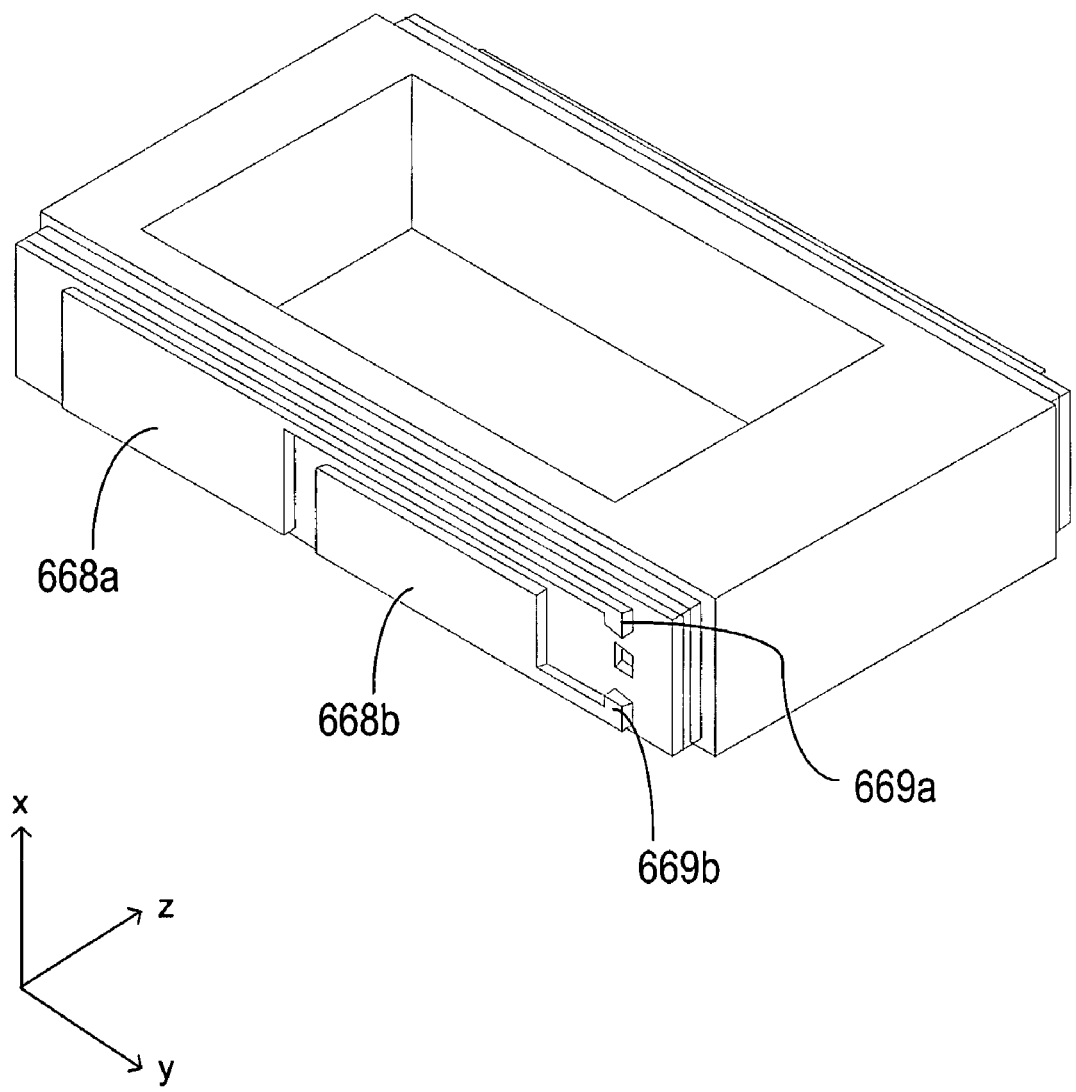

In an alternative embodiment, the top electrode is divided into first and second top electrodes 668*a-b,* as shown in FIG. 6. Each electrode is associated with a contact pad (669*a* or 669*b*). In one embodiment, the contact pads are located at or towards the first end of the major support member. Locating the contact pads at other locations of the major support member is also useful. Providing top electrodes divided into more than two electrodes is also useful. The use of multiple electrodes enables finer control of the movement of the major support member to improve or optimize performance of the piezoelectric device.

In one embodiment, an adhesion-promoting layer (not shown) is provided to enhance the adhesion between the lower electrode and the insulator layer. Another adhesion-promoting layer (not shown) can also be provided between the upper electrode and the piezoelectric film to improve adhesion between the two layers. The adhesion-promoting layers comprise, for example, titanium. Other types of adhesion-promoting layers are also useful.

The various layers of the piezoelectric stack, in one embodiment, are formed using thin film deposition techniques. Such techniques include, for example, sputtering, pulse laser deposition (PLD), evaporation, CVD, MOCVD, spin-coating and dip-coating. In one embodiment, the layers formed by thin film processes comprise a thickness of less than about 5 μm (e.g., the piezoelectric film). Alternatively, the piezoelectric stack is preformed and mounted onto the support structure using, for example, a bonding agent. Other techniques for providing the piezoelectric stacks are also useful.

Figure 7A:
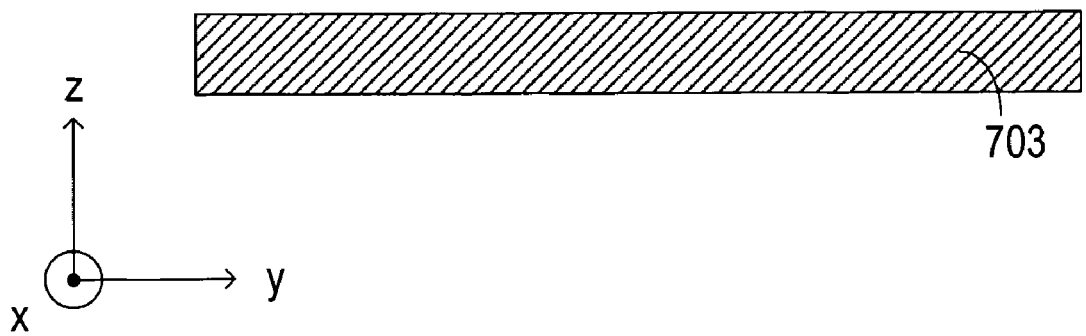
FIGS. 7a-g show a process for forming an electromechanical device in accordance with one embodiment of the invention.

FIGS. 7*a-g* show cross-sectional views of a process for fabricating a piezoelectric device in accordance with one embodiment of the invention. Referring to FIG. 7*a,* a first substrate 703 is provided. In one embodiment, the first substrate is used to form a plurality of devices in parallel. The first substrate is used to fabricate the central portion of the support structure of the piezoelectric device, which includes the minor members. In one embodiment, the first substrate comprises a single crystalline material, such as silicon. For example, the substrate comprises a 4-inch silicon wafer. Providing wafers of other sizes is also useful. Other types of single crystalline material as well as non-single crystalline material are also useful. For example, materials such as glass, ceramic, glass-ceramic, or a combination thereof can be employed.

The thickness of the first substrate defines the width of the minor support structures, which contributes to the overall thickness of the support structure. Typical thickness of the silicon wafer is about 200-900 μm. Other thicknesses are also useful, depending on design requirements. In one embodiment, the first substrate is polished on both sides. Polishing the substrate surface can enhance, for example, bonding quality. When the substrate is polished, the reduction in thickness due to the polishing should be taken into account. In one embodiment, the crystallographic orientation <110> of the substrate is in the direction of the thickness of the substrate (z-direction).

Figure 7B:
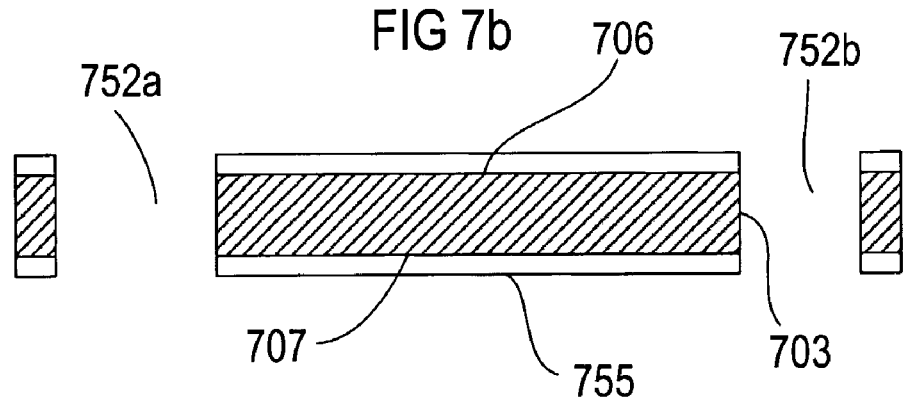

Referring to FIG. 7b, a portion of the substrate after patterning to form the minor support members (e.g., central portion) of the support structure is shown. Illustratively, the portion of the substrate represents the fabrication of first and second piezoelectric devices. In one embodiment, the first substrate is patterned to form through-grooves 752a-b. The grooves correlate to a single rectangular cavity for each piezoelectric device. Other types of patterns are also useful, depending on the desired cavity pattern or number of cavities.

In one embodiment, the minor support members are formed by micromachining techniques. Such techniques include, for example, wet or dry etching techniques. Other techniques are also useful. In one embodiment, patterning of the first substrate is achieved using wet etching techniques for (110) oriented silicon wafer.

The substrate is prepared for the patterning process. In one embodiment, a hard mask 755 is used to pattern the substrate. Other techniques for patterning the substrate are also useful. A hard mask is formed on first and second major surfaces 706 and 707 of the first substrate. The hard masks, in one embodiment, comprise silicon oxide. Other types of hard mask material can also be used. For example, silicon nitride can be used to serve as a hard mask. The silicon oxide hard mask, in one embodiment, is formed by thermal oxidation, which includes processing the substrate in an oxidizing ambient environment at a temperature of about 900-1200° C. for about 10 hours. Other techniques for forming the hard mask, such as chemical vapour deposition or sputtering, are also useful. The thickness of the hard mask should be sufficient to withstand the patterning process. In one embodiment, the hard mask is about 2 μm thick. Other thicknesses are also useful.

After the hard masks are formed, soft masks (not shown) are formed thereon. In one embodiment, the soft masks comprise photosensitive material, such as photoresist. Other photosensitive materials are also useful. The soft masks are patterned using conventional photolithographic techniques to selectively expose portions of the hard masks. For example, the soft masks are selectively exposed to radiation of appropriate wavelength through a lithographic mask having the desired pattern. In one embodiment, the soft masks are exposed one at a time. After exposure, the soft masks are developed to remove the exposed or unexposed portions, depending on whether a positive or negative-type photosensitive material is used. This creates windows or openings in the soft masks corresponding to the grooves to be formed in the substrate. The patterns of the soft masks preferably are identical.

A wet etch is then performed to remove portions of the hard masks exposed by the soft masks. The wet etch is performed, by example, dipping into the wet etch solution. The etch solution, in one embodiment, comprises hydrofluoric acid and aqueous ammonium fluoride. Other types of wet etch solutions are also useful. Wet etching techniques are preferred as both hard masks are patterned at the same time. Other techniques for patterning the hard masks, such as dry etching, are also useful.

After the hard masks are patterned, the soft masks are removed. The substrate is then wet etched to form grooves 752a-b therethrough. The wet etch is performed by, for example, immersing the substrate in a wet etch solution. In one embodiment, the wet etch solution for etching the substrate comprises an aqueous potassium hydroxide solution. Other types of etch solutions can also be useful. For example, the etch rate of a (110)-oriented silicon wafer in a 30% by weight etch solution is about 13 μm per hour at 60° C. The etching time can be controlled to ensure that the substrate is completely etched through to produce the grooves.

In one embodiment, the crystallographic direction of the substrate is oriented to result in substantially an anisotropic wet etch process. The wet etch ratio between the forward <110> direction and sideward <111> direction of the (110) silicon wafer is approximately 200:1-300:1. Therefore, by orienting the silicon substrate in the <110> direction (e.g., (110) plane is parallel to the top and bottom surfaces 706 and 707), the wet etch would result in substantially an anisotropic etch, enabling the formation of the grooves while substantially suppressing sideward etching.

Alternatively, the minor support members can be formed using a dry etch, such as a deep reactive ion etch (DRIE) or other dry etch techniques which includes sputter etching and vapour phase etching. The etch can be performed from one or both major surfaces of the substrate. For example, the dry etch could form the grooves by etching from the top or bottom surface or first etching from the top and then etching from the bottom. Only the surface that is etched would need a hard mask. Other techniques for patterning the substrate are also useful. The technique employed for patterning the substrate may also depend on the material of the substrate.

After the substrate is patterned, the hard masks are removed. Removal of the hard masks can be achieved by a wet etch. The wet etch, for example, comprises an etch solution of hydrofluoric acid solution. The substrate may then be subjected to preparation for subsequent processing. Such preparation, for example, may include chemical mechanical polishing (CMP) to improve surface roughness of the substrate surfaces. After polishing, the substrate is then cleaned. In one embodiment, the substrate is cleaned with standard RCA1 and RCA2 solutions and rinsed with deionized water. Other cleaning processes can also be useful.

Referring back to FIG. 7c, second and third substrates 721a-b are attached to the first patterned substrate. In one embodiment, the second and third substrates comprise silicon. Other types of materials, such as glass, ceramic or glass-ceramic, can also be useful. Additionally, it is not necessary that the second and third substrates be formed from the same material. In one embodiment, the second and third silicon substrates are oriented in the <100> direction. Other crystallographic orientations are also useful.

In one embodiment, the second and third substrates are attached to the patterned first substrate 703 by elevated temperature process, such as fusion bonding. Other techniques for attaching the substrates, such as anodic bonding, adhesive bonding, or thermocompression bonding, are also useful.

In one embodiment, the second and third substrates are prepared prior to fusion bonding. Preparation may include, for example, polishing both sides of the substrates to improve surface roughness and cleaning them in RCA2 and RCA1 solutions, followed by rinsing in deionized water. Treating the substrates in the RCA1 solution promotes hydrophilic surfaces on the substrates. Using substrates with hydrophilic surfaces advantageously enables low temperature pre-bonding before fusion bonding at high temperature. Alternatively, the substrate surfaces may also be treated with plasma to provide hydrophilic surfaces.

The second substrate is attached to the first substrate and subjected to a pre-bonding treatment in a wafer bonder. Pre-bonding treatment includes, for example, applying pressure and/or moderately elevating the temperature. The pre-bonding treatment is preferably performed while the substrate surfaces are hydrophilic. After pre-bonding treatment, the first and second substrates are then bonded together by annealing at about 900-1200° C. for about 2 hours. The pre-bonding and bonding procedure is repeated for the third substrate, thereby completing the bonding of the substrates.

Typically, the substrates are about a few hundreds of micrometers thick. This thickness may be greater than desired. If so, the thickness of the second and third substrates can be reduced. The thickness of the second and third substrates, in one embodiment, is reduced to about 1-60 µm. Other thicknesses can also be useful, depending on design requirements. Various techniques, such as mechanical lapping, chemical wet etching or plasma etching, can be used to reduce the thickness of the substrates. Other techniques are also useful. In one embodiment, the thickness of the substrates is reduced by mechanical lapping. To improve surface roughness after the thinning process, the substrate surfaces can be polished by, for example, CMP.

In alternative embodiments, the second and third substrates comprise SOI substrates. Typically, an SOI substrate comprises an insulating layer sandwiched by first (e.g., bulk) and second (e.g., surface) silicon wafers. Usually, one of the silicon wafers (e.g., surface) is thinner than the other (e.g., bulk). In one embodiment, the thinner silicon wafer is bonded to the first substrate which forms the central portion of the support structure. The use of SOI wafers, for example, can eliminate or reduce the duration of the thinning process of silicon.

The silicon wafers which are not bonded to the first substrate are removed by wet etch. For example, the substrate stack is dipped into a wet etch solution which dissolves silicon, such as an aqueous potassium hydroxide solution. Other techniques for removing the top silicon wafers of the SOI substrate, such as dry etching, are also useful. A protective coating or mechanical chuck can be used to protect the periphery of the first substrate and bottom silicon wafers of the SOI substrates which are bonded to the first substrate.

After the top silicon wafers of the SOI substrates are removed, a wet etch is used to strip off the silicon oxide insulator layers of the SOI substrates. The wet etch comprises, for example, HF acid solution. Other techniques or chemistry can also be used to remove the silicon oxide layers. For example, the silicon oxide layers can be removed by dry etching.

Figure 7C:
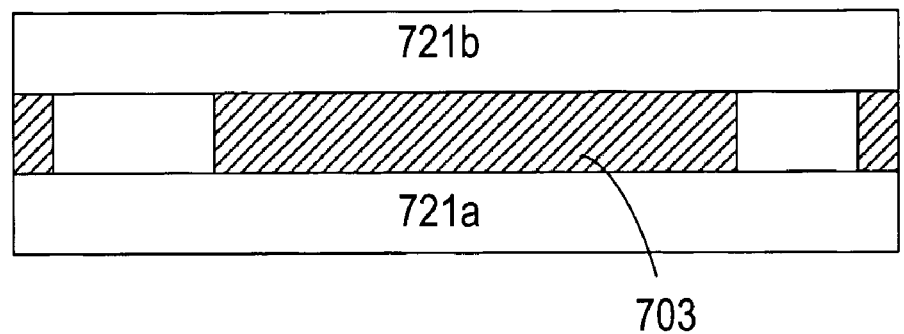
Figure 7D:
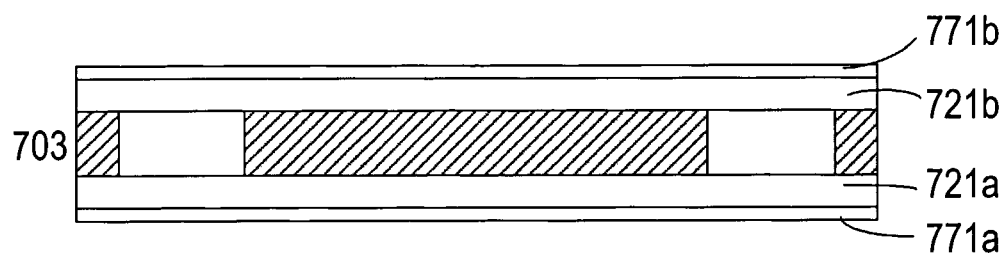

Referring to FIG. 7d, insulator layers 771a-b are deposited on the outer surfaces of the second and third substrates 721a-b. In one embodiment, the insulator layers comprise silicon oxide. Other types of dielectric or insulating materials are also useful. The layers are deposited by, for example, chemical vapour deposition (CVD) techniques. Various types of CVD or other techniques can be used. In one embodiment, the insulator layer is deposited using plasma enhanced CVD (PECVD) at a temperature of about 280° C. The thickness of the insulator layer is about 0.5 µm. Other thicknesses are also useful.

Figure 7E:
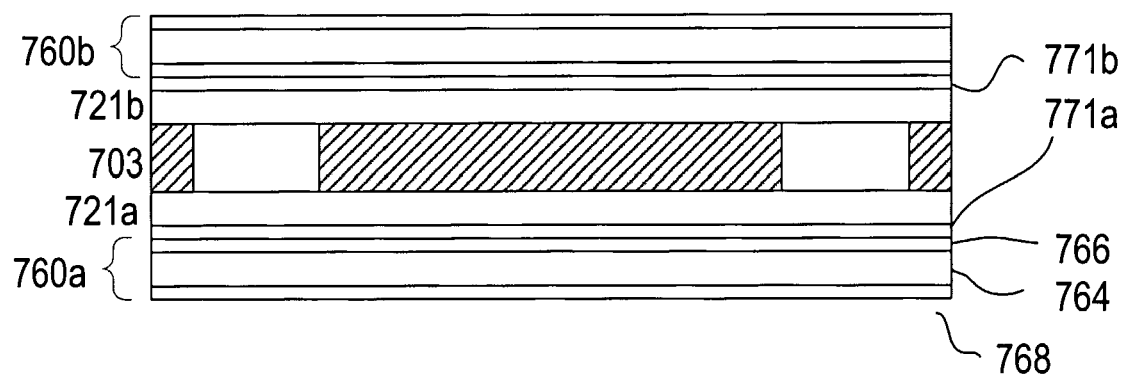

Referring to FIG. 7e, the various layers of the piezoelectric stacks 760a-b are deposited on the insulator layers. In one embodiment, the various layers of the stack are formed one at a time on both sides of the substrate stack, one side at a time. For example, the bottom electrode is formed on one side of the substrate stack followed by flipping the substrate stack and forming the bottom electrode on the other side. Other arrangements for forming the stacks are also useful. For example, all layers of one stack are formed and then the substrate is flipped to form the other stack.

In one embodiment, bottom electrode layer 766, piezoelectric layer 764 and top electrode layer 768 are sequentially deposited on the insulating layer. An adhesion-promoting layer can be provided on the insulating layer to promote adhesion between it and the bottom electrode layer. Various techniques can be employed to deposit the piezoelectric stack layers. In one embodiment, the layers of the piezoelectric stack are formed by thin film deposition techniques. Such techniques, for example, include sputtering, pulsed laser deposition, evaporation, CVD, spin-coating and dip-coating. The thin film process deposits the layers having a thickness of less than about 5 µm each. Other techniques for forming the different layers are also useful. Preferably, but not necessarily, the various corresponding layers of the stacks are the same or similar.

In one embodiment, the adhesion-promoting layer comprises titanium of about 50 nm thick. The adhesion-promoting layer is deposited by sputtering. The bottom electrode layer comprises a noble metal. In one embodiment, the bottom electrode layer comprises platinum. The bottom electrode layer, for example is about 0.3 µm. The Ti and Pt layers are preferably deposited within one sputtering cycle for each side of the substrate stack.

The piezoelectric layer comprises a PZT. Preferably, the PZT comprises a target composition around the MPB, such as $Pb(Zr_{0.52}Ti_{0.48})O_3$. Other target compositions are also useful. The thickness of the piezoelectric layer is about 0.3-20 µm. Preferably, the thickness of the piezoelectric layer is less than about 5 µm. The PZT layer is deposited by, for example spin-coating, such as the sol-gel or metal-organics decomposition (MOD). Other techniques, such as CVD, pulsed laser deposition and sputtering, are also useful.

In one embodiment, a precursor solution containing the compositional elements of the piezoelectric layer is spin-coated on the bottom electrode and heated to form the piezoelectric layer. The wet layer is dried at a temperature of about 110° C. for about 2 minutes, and subsequently subjected to a pyrolysis process at about 410° C. for about 10 minutes. The spin-coating, drying and pyrolysis processes are repeated for about three times before the layer is heated at around 560° C. for 20 minutes. The before-mentioned processes, in one embodiment, are repeated for another 2 times, after which the layer is annealed at about 700° C. for 5 minutes. The piezoelectric layer, after the process, is preferably fully crystallized without cracking.

The top electrode layer is deposited on the piezoelectric layer. In one embodiment, the top electrode comprises a noble metal. In one embodiment, the top electrode comprises gold. Other types of noble metals or conductive materials are also useful. The thickness of the upper electrode is about 0.2 µm. Providing a top electrode having other thicknesses is also useful. In one embodiment the top electrode layer is deposited by sputtering. Other deposition techniques for forming the top electrode layer are also useful.

An adhesion-promoting layer can also be formed prior to the top electrode layer to promote adhesion of the top electrode layer to the piezoelectric layer. The adhesion-promoting layer, for example, comprises titanium. Other types of adhesion-promoting materials are also useful. In one embodiment, the thickness of the adhesion-promoting layer is about 20 nm. Other thicknesses are also useful.

Figure 7F:
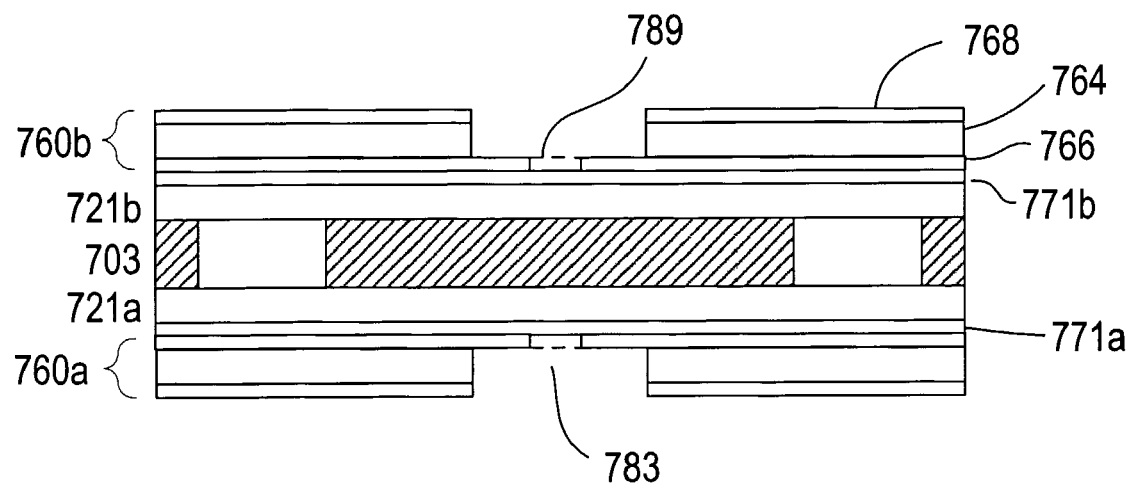

Referring to FIG. 7f, the layers on the substrate surfaces are patterned as desired to form the piezoelectric stacks 760a-b. Various mask, etch, and lift-off techniques can be used to form the piezoelectric stack. For example, wet or dry etch techniques can be used to pattern the various layers of the piezoelectric stacks.

In one embodiment, the various layers are patterned using wet etch techniques. A photoresist layer is formed and patterned to form a mask layer over the top electrode layer. The resist mask can be used to pattern the piezoelectric stack. Different chemistry can be used for the different layers. For example, the top electrode layer is etched in an aqueous iodine solution and an aqueous potassium iodide solution while the piezoelectric layer is etched in a $HNO_3$ and HF acid solution. Other etch solutions can also be used to pattern the various layers.

In one embodiment, the mask is used to pattern the top electrode layer to form a single top electrode, such as that shown in FIG. 2. Providing a mask which is used to form two (as shown in FIG. 6) or more top electrodes is also useful. Subsequently, another mask may be used to form a contact window to the bottom electrode.

As described, the layers are patterned using wet etch techniques. Wet etching is preferable as various layers of the piezoelectric stacks on both top surfaces of the second and third substrates can be patterned simultaneously. Alternatively, the layers can be patterned using a combination of dry, wet etch, and lift-off techniques. For example, the top electrode can be patterned using a lift-off process, the bottom electrode layers can be formed by a wet etch process and the piezoelectric layer can be patterned by a dry etch process. In one embodiment, the dry etch comprises plasma etching using $CHF_3/Ar$. Other configurations for patterning the layers are also useful.

In an alternative embodiment, the various layers of the piezoelectric stack are etched individually, using wet or dry etch techniques. Other combinations of etching the various layers of the piezoelectric stack are also useful.

In yet an alternative embodiment, a contact window to the bottom electrode may be avoided if the patterning process results in exposing a portion of the bottom electrode. For example, the bottom electrode can be extended on at least one end of the electrode stack. Other configurations which expose the bottom electrode without requiring a contact window are also useful.

In one embodiment, the patterning of the piezoelectric stacks leaves the insulator layer on the surface of the second and third substrates, as shown in FIG. 7f. In some cases, the bottom electrode may also remain on the surface of the second and third substrates, indicated by the dotted lines 789. To facilitate dicing of the substrate, dicing channels may be formed on the substrate. The dicing channels are located in an area 783, for example, between two electrode stacks. To form the dicing channels, portions of the bottom electrode and insulator layers are removed (if present). In one embodiment, the bottom electrode is etched using ion milling while the insulator layer is plasma etched using $CF_4$. Other techniques for patterning the layers are also useful.

Figure 7G:
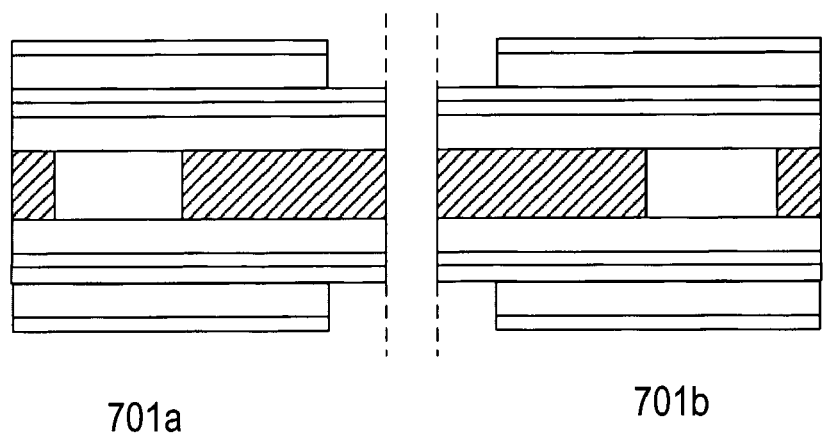

The substrate stack is then diced into individual devices 701a-b, as shown in FIG. 7g. In one embodiment, a protective layer is temporarily coated on the stack to protect the underlying layers from damage during the dicing process. For example, a layer of photoresist may be spin-coated on each side of the stack, followed by hard baking, prior to dicing. After the dicing is completed, the photoresist layers can be removed with, for example, acetone solution. The devices are then activated by applying an electric field (e.g., 180 kV/cm) to electrically pole the piezoelectric films. After the electrical poling, the films exhibit piezoelectric properties.

In another embodiment, the support structure is formed first by, for example, patterning the first substrate and bonding the second and third substrates, as described in FIGS. 7a-c. After the wafer stack is formed, preformed piezoelectric stacks are mounted onto the substrate using a bonding agent, such as an adhesive or tape. For such applications, the preformed piezoelectric stacks may also include the insulator layer as well. The dicing channels, if desired, can be formed prior to mounting the preformed piezoelectric stacks. Thereafter, the wafer is diced to form separate piezoelectric devices. Alternatively, the wafer stack is diced prior to individually mounting the preformed piezoelectric stacks.

Figure 8:
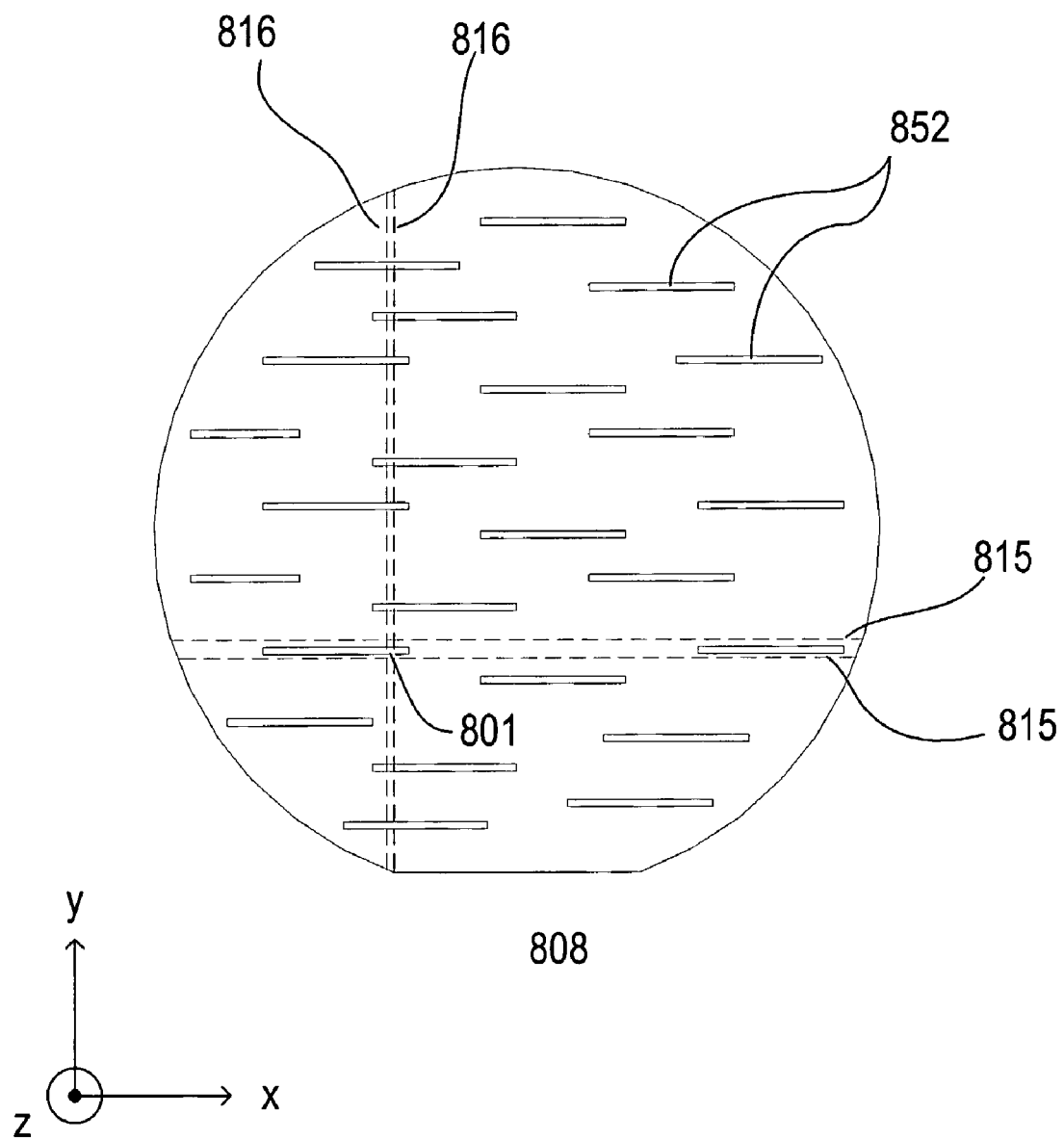
FIG. 8 shows a layout of a substrate in accordance with one embodiment of the invention.

FIG. 8 shows a top view of a substrate stack 808 used to form a plurality of piezoelectric devices. The substrate stack includes a first substrate sandwiched by second and third substrates. Grooves 852 are formed in the first substrate. The grooves correspond to cavities of support structures. As shown in FIG. 8, the length of the grooves is in the x-direction. In one embodiment, single crystal silicon wafer with (110) orientation is used as the first substrate, and the length direction of the grooves is aligned within the (111) plane of the single crystal silicon wafer. Piezoelectric stacks are formed on top surfaces of second and third substrates (not shown). Dicing of the substrate is performed along the x-direction 815 and y-direction 816. Piezoelectric devices 801 are located at the intersection of the dicing lines. Although only two dicing lines in each direction are shown, it is understood that there are many more dicing lines in both directions.

As illustrated, each groove can be used to form multiple devices. The grooves can be disposed on the first substrate to optimize the number of devices formed on a substrate. By forming multiple devices from the substrate stack, a large number of devices may be produced in one processing cycle. Production consistency and efficiency is therefore significantly improved, reducing manufacturing cost.

Figure 9A:
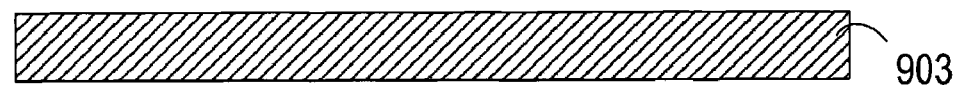
FIGS. 9a-c show a portion of a process for forming an electromechanical device in accordance with another embodiment of the invention.
Figure 9B:
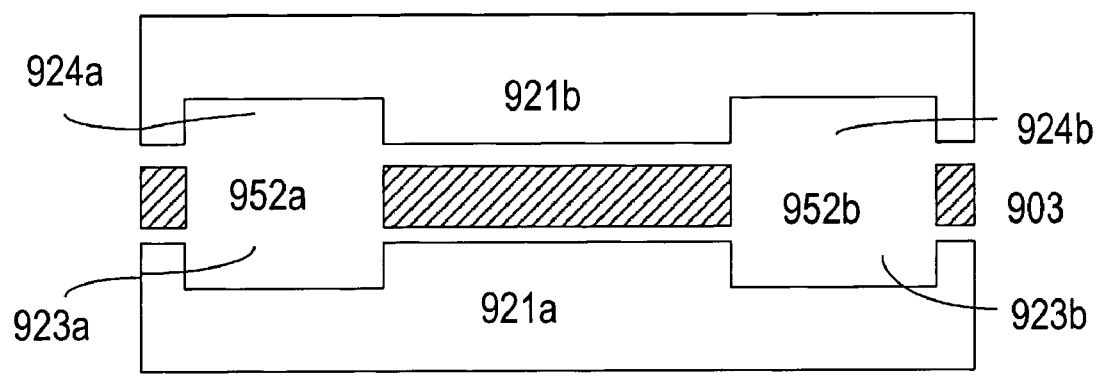
Figure 9C:
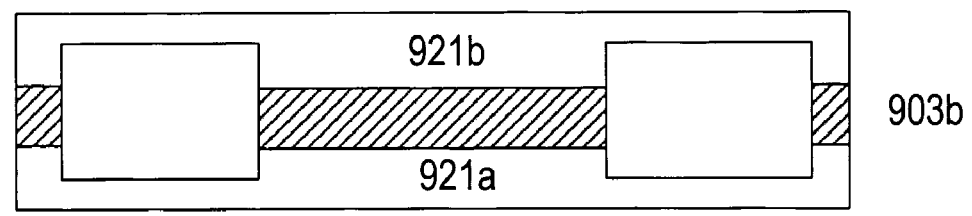

FIGS. 9a-c show a partial process for forming a piezoelectric device in accordance with another embodiment of the invention. Referring to FIG. 9a, a first substrate 903 is provided. Preferably, the first substrate is used to form a plurality of devices in parallel. The first substrate is used to fabricate the central portion of the support structure of the piezoelectric device, which includes the minor members. In one embodiment, the first substrate comprises a non-crystalline material, such as glass. Other types of non-crystalline materials are also useful. The glass substrate, in one embodiment, is a 4-inch Pyrex 7740 glass substrate.

The first substrate is patterned to form minor support members of support structures for piezoelectric devices. In one embodiment, the first substrate is patterned to form grooves 952a-b. The substrate can be patterned by various techniques, such as laser cut, ultrasonic cut, or deep reaction ion etching (DRIE). Other patterning techniques are also useful. In one embodiment, the glass substrate is patterned with DRIE. The parameters of the DRIE process are described in Table 1. Other DRIE process parameters are also useful.

TABLE 1

| Gas flow | About 7 sccm of $SF_6$ plasma |
| --- | --- |
| Pressure | About 0.2 Pa |
| Inductive coupling power | About 150 W (constant) |
| Self-bias voltage | 190 to −390 V |

Referring to FIG. 9b, second and third substrates 921a-b are provided. The second and third substrates are attached to the first patterned substrate. Preferably, the materials of the substrates have closely matched coefficients of expansion. By having closely matched coefficients of expansion, the stress on the support structure caused by various process steps to form the piezoelectric device is reduced since all the members expand and contract about the same amount. This results in minimized stress, thus improving reliability for the support structure.

In one embodiment, the second and third substrates comprise silicon. The use of SOI substrates or other types of materials which have a similar coefficient of expansion as the first substrate are also useful. Additionally, it is not necessary that the second and third substrates be formed from the same material. In one embodiment, the second and third silicon substrates are oriented in the <100> direction.

In one embodiment, the second and third substrates are prepared with recesses 923a-b and 924a-b which correspond to the locations of the grooves in the first substrate. In one embodiment, the depth of the recesses is about 2-20 μm. Other depths are also useful. The recesses can be formed using various mask and etch techniques, such as wet or dry etching.

In one embodiment, a hard mask is used to etch the silicon substrates. The hard mask comprises, for example, silicon oxide. Other types of hard mask materials can also be used. The hard mask material, in one embodiment, is formed by thermal oxidation. Other techniques, such as CVD, can also be used to form the hard mask.

A soft mask layer, such as photoresist, is deposited and patterned over the hard mask layer. The hard mask layer unprotected by the soft mask is removed by, for example, wet etching. In one embodiment, the wet etch solution comprises hydrofluoric acid and an aqueous ammonium fluoride solution. Other types of wet etch solutions can also be used. Alternatively, dry etching, such as RIE, can also be used to etch the hard mask. The RIE can be performed using, for example, $CHF_3/O_2$ (100 sccm/2 sccm) at about 100-150 W and 30-40 mT. Etching the hard mask creates openings that expose portions of the silicon substrate to be etched to form the recesses.

The second and third substrates are then patterned to form the recesses. In one embodiment, a wet etch is employed to pattern the substrates. The wet etch solution comprises KOH solution. A protective layer can be deposited on the sides of the substrates to protect them from the etch solution. Alternatively, the substrate is etched by a dry etch, such as DRIE with $C_4F_8/SF_6$. Other types of etch techniques are also useful. After patterning the substrates, the hard masks are removed with a wet etch using hydrofluoric acid. The wet etch also removes any native oxide on the non-etched surfaces.

Referring to FIG. 9c, the second and third substrates 921a-b are attached to the patterned first substrate 903. In one embodiment, the substrates are attached by anodic bonding. To prepare the substrates for bonding, all the substrates are cleaned. In one embodiment, the substrates are cleaned in $NH_4OH:H_2O_2:H_2O$ (1:1:5) and $HCl:H_2O_2:H_2O$ (1:1:5) baths. After cleaning, the substrates are bonded at about 350-400° C. with an applied voltage of about 1000V. After the substrates are bonded, the process continues to form the piezoelectric device, as described in FIGS. 7c-g.

Figure 10:
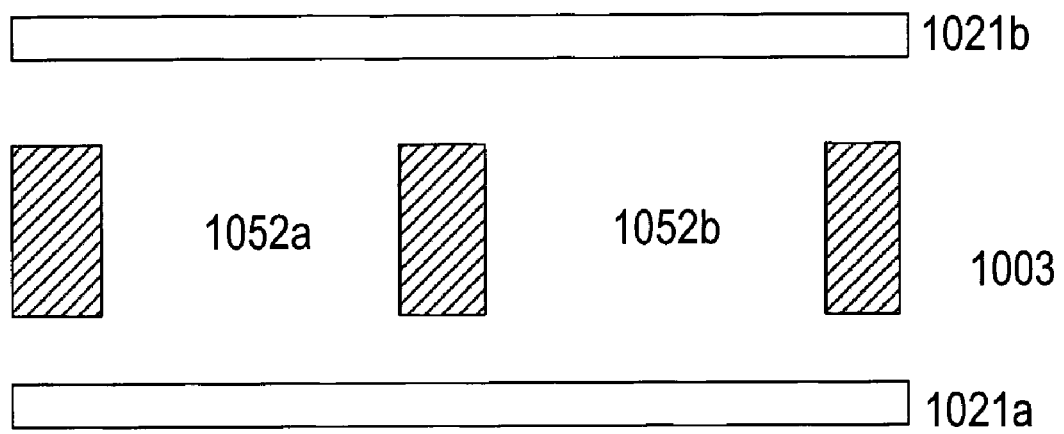
FIGS. 10-12 show processes for forming various cavity configurations of the support structure.
Figure 11:
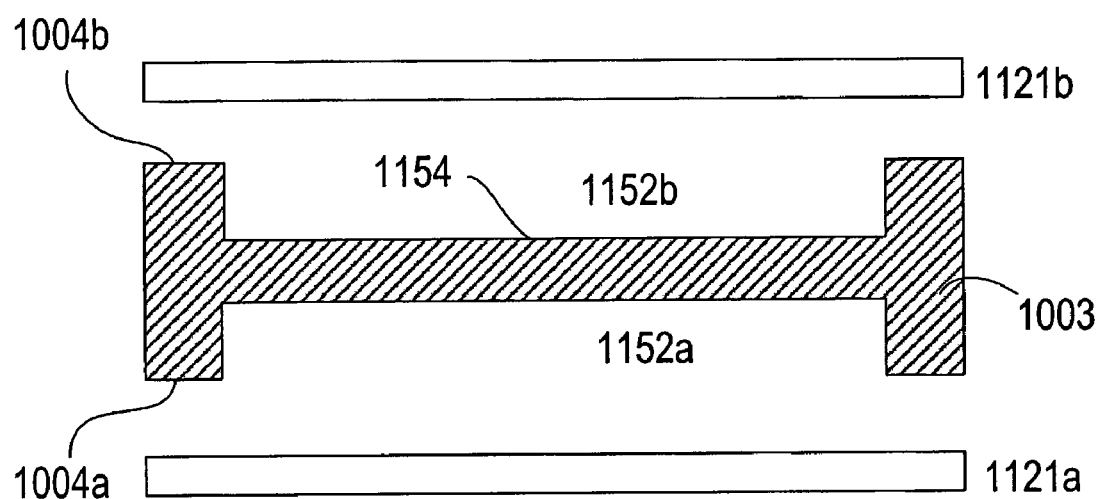
Figure 12:
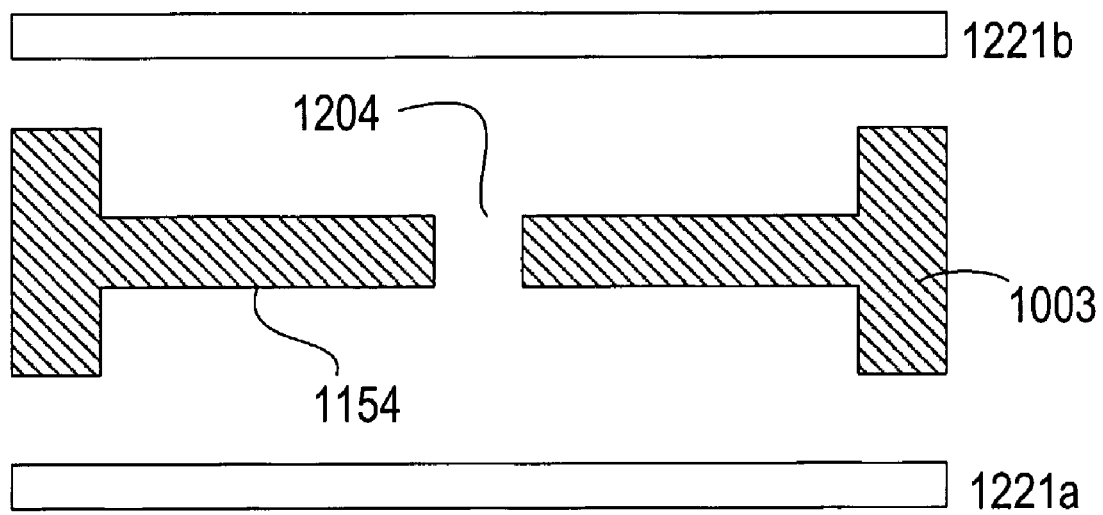

FIGS. 10-12 show various embodiments of patterning the first substrate to form different cavity configurations for the support structure. A first substrate 1003 is provided. The first substrate comprises, for example, silicon. Other types of materials are also useful. In one embodiment, the silicon substrate is oriented in the (110) plane.

Referring to FIG. 10, the substrate is patterned to form grooves 1052a-b. Various patterning techniques can be used to form the grooves, such as those described in connection with FIGS. 7a-b. In one embodiment, a wet etch is employed to form the grooves. Other techniques, such as dry etching, can also be useful. The etch is performed, for example, using a hard mask on one or both substrate surfaces. The first substrate provides first, second, and third minor support members for the support structure of the piezoelectric device. When the second and third substrates 1021a-b are attached to the first substrate, a support structure having first and second cavities formed by grooves 1052a-b is provided. Such a support structure is similar to that described in FIG. 5.

Referring to FIG. 11, the first substrate 1003 is patterned to form recesses 1152a-b from the top and bottom surfaces 1004a-b, separated by a mid-member 1154 of the substrate. In one embodiment, the recesses are formed by a wet etch. Hard masks are formed on both top and bottom surfaces of the substrate. The wet etch is timed such that it does not etch through the substrate, thereby leaving a mid-member 1154 separating the recesses. Alternatively, a dry etch can be performed from the top and bottom surfaces, one at a time. The dry etch etches the substrate partially from the top and bottom surfaces, forming recesses while leaving mid-member 1154. Other techniques for forming the recesses are also useful.

Figure 4:
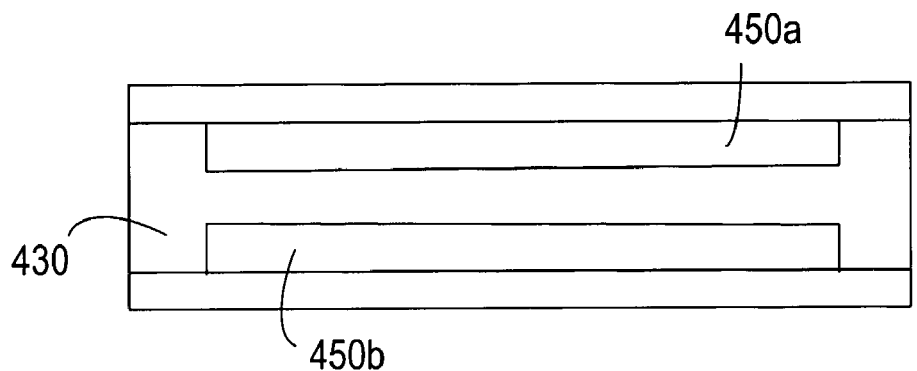
Figure 5:
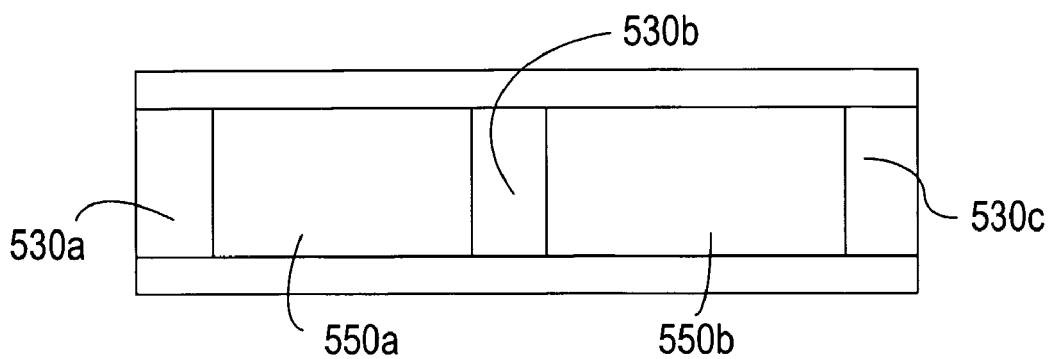

When the second and third substrates 1221a-b are attached to the first substrate, a support structure having first and second cavities formed by a single minor support member is provided, such as that described in FIG. 4.

Referring to FIG. 12, the first substrate 1003 is shown. In one embodiment, the first substrate is first patterned to form recesses, as described in FIG. 11. After the recesses are formed, a portion of the mid-member is removed to create a discontinuity 1204. The discontinuity can be formed using various techniques, such as wet or dry etching. If a wet etch is used, mask layers are formed on both top and bottom surfaces. Alternatively, if a dry etch is employed, then only one mask on one surface is needed. When the second and third substrates 1221a-b are attached to the first substrate, a support structure having an H-shaped cavity is formed, such as that described in FIG. 3.

As described, various cavity configurations can easily be formed using different mask patterns as well as additional lithographic steps. More complex patterns can also be formed by using multiple lithographic and etching steps.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for fabricating an electromechanical device comprising:
    forming a support structure having first and second support surfaces including providing a first layer, wherein the first layer comprises single crystal silicon with a <110> crystallographic direction parallel to a sandwich direction of a first, second and third layer sandwich, providing second and third layers, each having inner and outer surfaces, and attaching the inner surfaces of the second and third layers to the first layer to form the support structure, the outer surfaces of the second and third layers form the first and second support surfaces, wherein the support structure comprises at least one cavity between the second and third layers, the cavity is located adjacent to the inner surfaces of the second and third layers; and providing an electromechanical active element on at least one of the first and second support surfaces.

2. The method of claim 1 wherein the cavity comprises at least one edge which is perpendicular to the sandwich direction.

3. The method of claim 1 wherein the second and third layers comprise single crystal silicon and the second and third layers are attached to the first layer by anodic bonding at an elevated temperature.

4. The method of claim 1 wherein the electromechanical active element comprises an active film comprising a piezoelectric or an electrostrictive material.

5. The method of claim 4 wherein the electromechanical active element further comprises bottom and top electrodes sandwiching the active film.

6. The method of claim 5 further comprises at least one intermediate layer between the electromechanical active element and at least one of the first and second support surfaces.

7. The method of claim 4 wherein the active film is deposited using a thin film deposition technique.

8. The method of claim 7 wherein the electromechanical active element comprises a composition around a morphotropic phase boundary (MPB).

9. A method for fabricating an electromechanical device comprising:

forming a support structure having first and second support surfaces including
providing a first layer,
providing second and third layers, each having inner and outer surfaces, and
attaching the inner surfaces of the second and third layers to the first layer to form the support structure, the outer surfaces of the second and third layers form the first and second support surfaces, wherein the support structure comprises at least one cavity between the second and third layers, the cavity is located adjacent to the inner surfaces of the second and third layers;

providing an electromechanical active element on at least one of the first and second support surfaces; and wherein first, second and third wafers are provided for the first, second and third layers and further comprises forming a cavity array in the first wafer;

attaching inner surfaces of the second and third wafers to the first wafer to form a wafer stack;

providing electromechanical active elements on the outer surface of at least one of the second and third wafers; and dicing the wafer stack to form a plurality of electromechanical devices in parallel in a single fabrication cycle.

10. The method of claim 9 wherein the cavity array comprises elongated slots for providing at least one cavity in individual electromechanical devices located at intersections of dicing lines and elongated slots.

11. The method of claim 10 wherein the first wafer comprises a (110) oriented single crystal silicon wafer and a length direction of the elongated slots is aligned within the (111) planes of the single crystal silicon wafer.

12. The method of claim 9 further comprises coating at least one side of the wafer stack to protect the electromechanical devices from damage during dicing.

13. The method of claim 9 wherein electromechanical active elements are provided on first and second support surfaces of the second and third layers.

14. A method for fabricating a support structure for an electromechanical device comprising:

providing a first layer, the first layer comprises a first substrate with opposing surfaces having a primary slot;

providing second and third layers, the second and third layers comprise second and third substrates having inner and outer surfaces;

attaching the inner surfaces of the second and third substrates to respective opposing surfaces of the first substrate to form a substrate stack;

cutting the substrate stack to form one or more support structures, wherein a support structure includes at least one cavity between the inner surfaces of the second and third substrates corresponding to the primary slot; and wherein at least one of the outer surfaces of the second or third layers serve as a support surface for an electromechanical active element.

15. The method of claim 14 wherein:
the first substrate comprises a plurality of primary slots; and
cutting the substrate stack forms a plurality of support structures.

16. The method of claim 14 wherein:
the primary slot comprises a plurality of secondary slots; and
the support structure comprises a plurality of cavities corresponding to at least some of the secondary slots.

17. The method of claim 14 wherein:
the first substrate comprises a plurality of primary slots having secondary slots; and
cutting the substrate stack forms a plurality of support structures in which a support structure of the plurality of support structures comprises a plurality of cavities corresponding to at least some of the secondary slots of one of the plurality of primary slots.

18. The method of claim 14 wherein the primary slot is through the opposing surfaces of the substrate; and
attaching the layers comprises bonding the inner surfaces of the second and third substrates to the opposing surfaces of the first substrate to form a substrate stack.

19. The method of claim 18 wherein:
the first substrate comprises a plurality of primary slots; and
cutting the substrate stack forms a plurality of support structures.

20. The method of claim 18 wherein:
the primary slot comprises a plurality of secondary slots; and
the support structure comprises a plurality of cavities corresponding to at least some of the secondary slots.

21. The method of claim 18 wherein:
the first substrate comprises a plurality of primary slots having secondary slots; and
cutting the substrate stack forms a plurality of support structures in which a support structure of the plurality of support structures comprises a plurality of cavities corresponding to at least some of the secondary slots of one of the plurality of primary slots.

22. The method of claim 14 further comprises:
forming at least one electromechanical active element on at least one of the outer surfaces of the second and third substrates prior to cutting the substrate stack and cutting the substrate stack forms the electromechanical devices; or
forming electromechanical active elements on the outer surfaces of the second and third substrates prior to cutting the substrate stack and cutting the substrate stack forms the electromechanical devices.

23. The method of claim 22 wherein the electromechanical active element comprises an active film comprising a piezoelectric or an electrostrictive material.

24. The method of claim 14 wherein the substrates comprise glass, silicon, ceramic or a combination thereof.

* * * * *